Aug. 19, 1969 M. P. LEPSELTER 3,461,524

METHOD FOR MAKING CLOSELY SPACED CONDUCTIVE LAYERS

Filed Nov. 2, 1966

INVENTOR
M. P. LEPSELTER
BY
Sylvan Sherman
ATTORNEY

United States Patent Office 3,461,524 Patented Aug. 19, 1969

3,461,524

METHOD FOR MAKING CLOSELY SPACED CONDUCTIVE LAYERS

Martin P. Lepselter, New Providence, N.J., assignor to Bell Telephone Laboratories, Incorporated, Murray Hill and Berkeley Heights, N.J., a corporation of New York Filed Nov. 2, 1966, Ser. No. 591,641
Int. Cl. H01g *13/00*
U.S. Cl. 29—25.42 8 Claims

ABSTRACT OF THE DISCLOSURE

Method for making a pair of closely spaced conductors comprising the steps of depositing successive layers of conductor, filler material, and conductor on a substrate; selectively etching away the filler material and eliminating any exposed pinhole shorts. The method is particularly useful in the fabrication of thin film capacitors and crossovers because of the relative ease with which pinhole shorts can be eliminated.

This invention relates to a method for forming two closely spaced conductive layers which are free from "pinhole" short circuits and, more specifically, it concerns methods for making thin film capacitors and thin film crossovers.

An intensive effort to increase the reliability and performance of electronic products while reducing their size has led to a microelectronic technology that has shrunk circuit elements to dimensions almost invisible to the unaided eye. The microscopic dimensions of these new circuit elements has resulted in circuits that are rugged, long-lasting, low in cost and capable of performing electronic functions at extremely high speed. (Cf. Hittinger and Sparks, Microelectronics, Scientific American (November 1965) p. 57.)

One problem which limits the minimum size of microelectronic circuits and elements is the phenomenon of "pinhole" short circuits. When a layer of metal is deposited on a thin film of insulating material, the metal often penetrates through tiny holes in the thin film and makes electrical contact with whatever lies under the thin film. When the underlying material is a conductor, the result is a direct short, termed a "pinhole" short. Since the probability of obtaining a pinhole short increases as the thickness of the film separating the two conductors decreases, there is a practical limit to the minimum spacing which can be realized between two conducting layers. This limitation has at least two effects. First, it at least partially frustrates the goal of reducing the size of circuit by preventing any further reduction in the size of circuit elements. And, second, it limits the performance of certain types of circuit elements. For example, in the case of a capacitor, it places limits on the specific capacitance that may be obtained since the specific capacitance is inversely proportional to the spacing between the two electrodes.

Accordingly, the broad object of the present invention is to form closely spaced conductive layers which are free from pinhole shorts.

The foregoing object is accomplished in accordance with the invention by a method of fabrication which includes the steps of placing initially a spacing filler material of suitable thickness between the conductive layers, etching away the spacing filler, thereby exposing pinhole shorts, eliminating any of the then-exposed shorts, and, if desired, forming or placing a dielectric or other material between the conductive layers.

The invention has particular application when it is desired to provide a separation between two conductors of a few microns or less, because pinhole shorts begin to become a significant problem at such small separations. In typical applications the thickness of the conductive layers varies from one to ten microns. Advantageously, the layers are sufficiently rigid that the structure retains geometrical stability after the filler layer is removed.

The invention will now be described in greater detail by reference to the accompanying drawings wherein.

Figure 1:
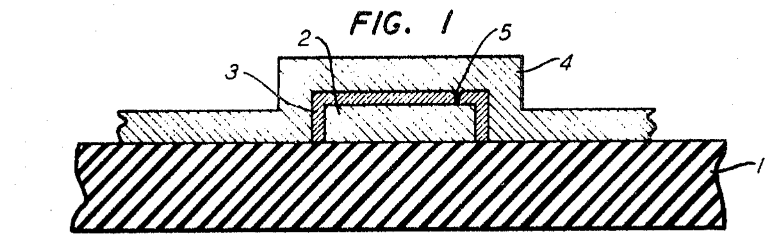
FIG. 1 is a schematic cross section of a typical structure used to make a capacitor in accordance with the invention.

FIG. 1 is a cross section of a typical structure used to make a thin film capacitor in accordance with the invention. There is shown a structure comprising three layers of material upon an insulating substrate 1. A first conductive layer 2 is shown deposed upon the substrate, a layer of filler material 3 is on top of the conductive layer 2, and a second conductive layer 4 is shown deposited on top of the filler 3.

The type of material for the filler layer and its dimensions are chosen so that when it is etched away it will leave the desired empty space. The material need not be a dielectric so long as it is etchable by means which do not etch the conductive layers 2 and 4.

A pinhole-short-free thin film capacitor is made from the aforementioned structure in accordance with the invention by selectively etching away the filler layer 3 and eliminating any pinhole shorts.

Ferric nitrate is an appropriate etchant to selectively remove copper filler from between gold conductive layers. Advantageously the structure can be etched in a transducer agitated etchant.

Once the filler has been etched away, any pinhole shorts that may have formed between the conductive layers 2 and 4 may be easily eliminated. The shorts are exposed and appear as thin columns or whiskers connecting the layers 2 and 4, as shown by column 5 in FIG. 1. Since the thickness of the exposed column is generally small compared to the dimensions of the conductive layers, techniques such as oxidation, ultrasonic cleaning or centrifuging may be used to eliminate the shorts. For example, a thin layer of oxide generally forms over metals exposed to the atmosphere, and often this layer of oxide is sufficiently thick to oxidize the entire shorting column. But if this alone is not found to be sufficient, the structure can be heated in an oxygen enriched atmosphere until the columns are completely oxidized. Another technique for eliminating the exposed columns is to immerse the structure in a transducer-agitated liquid. This process breaks the shortening columns. A third technique found to be suitable is to amount the structure on a centrifuge with the conductive layers facing out and to rotate the centrifuge with sufficient speed so that the layers are bowed outward, thus breaking the shorting columns. Many other suitable means such as mild etching or other chemical processes can also be used to eliminate the shorting columns or to convert them into insulating compounds.

The space between the conductive layers will, of course, act as a dielectric. If, however, it is desired to place a solid dielectric or other material between the two layers, this can generally be accomplished by one of several techniques. For example, if the conductive layers can be oxidized, heating the structure in an oxygen-bearing atmosphere results in the formation of oxide layers on the internal surfaces, and in appropriate instances, the oxide can be built up sufficiently to fill the space. Also the well-known techniques of "plasma cracking" and anodization can be used to back-fill materials between the closely spaced layers.

Figure 2:
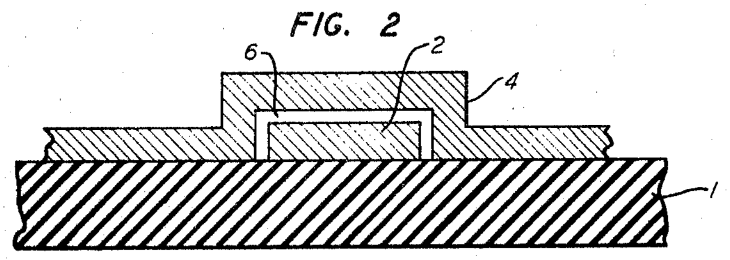
FIG. 2 is a cross section of a completed capacitor made in accordance with the invention.

FIG. 2 shows the completed capacitor. The filler 3 of FIG. 1 and the pinhole-short 5 of FIG. 1 have been removed and are replaced by an air gap 6.

An illustrative example of a crossover made in accordance with a typical practice of the invention will now be described in detail.

Figure 3:
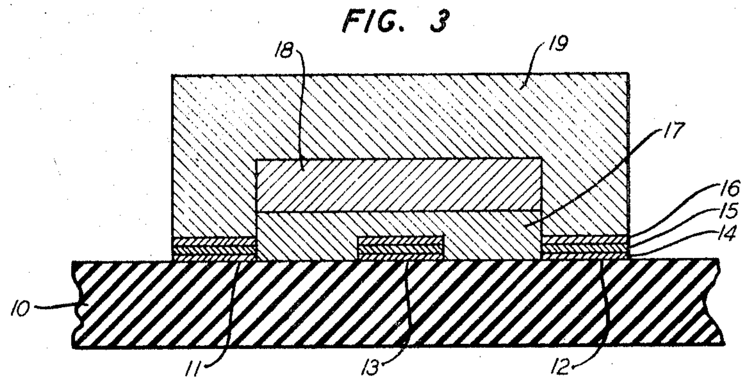
FIG. 3 is a schematic cross section of a typical structure used to make a thin film crossover in accordance with the invention.

FIG. 3 is a cross section of a typical structure used in the production of a thin film crossover in accordance with the present invention. Metal contacts 11 and 12 between which it is desired to provide an electrical connection which is to cross over an intermediate conductor 13 are shown deposed upon an insulating substrate 10 such as, for example, silicon with a layer of $SiO_2$ or $SiN_2$ on top. Advantageously in accordance with present beam lead techniques the contacts 11 and 12 and the intermediate conductor 13 each comprise three different films of metal deposited one upon the other. The first film 14 is titanum to secure good adherence to the substrate 10, the third film 16 is gold for ease of bonding and the second film 15 is platinum to keep the gold and titanium from reacting with one another. In addition, a layer 17 of an oxidizable metal such as zirconium which can be oxidized to form a dielectric layer is shown upon the conductor 13. Typical thicknesses are as follows: titanium, 1500 angstroms; platinum, 3000 angstroms; gold 20,000 to 30,000 angstroms and zirconium 15,000 angstroms.

On top of the oxidizable layer 17 there is shown a spacing layer 18 of filler material. In this particular example a layer of copper 30,000 angstroms thick is utilized.

An upper conducting layer 19, typically comprising 10 to 12 microns of gold is disposed on the spacing layer 18, to interconnect contacts 11 and 12. Prior to its deposition, the spacing layer 18 and the oxidizable layer 17 are approximately masked and etched so that the upper conductor 19 make contact with the contacts 11 and 12.

A pinhole-short-free crossover is made from this illustrated structure by etching away the filler 18 with an appropriate etchant which little affects the other metals and heating the structure in an oxygen-bearing atmosphere for a time sufficient to completely oxidize the oxidizable metal layer 17. For the structure shown etching in concentrated ferric nitrate for a period in excess of about ten minutes removes the copper filler and heating to about 350° C. for five to eight hours oxidizes the zirconium layer.

Any pinhole shorts between the upper conductor 19 and the lower conductor 13 are exposed after the spacing layer 18 is etched away and can be readily eliminated by one of the aforementioned techniques.

Figure 4:
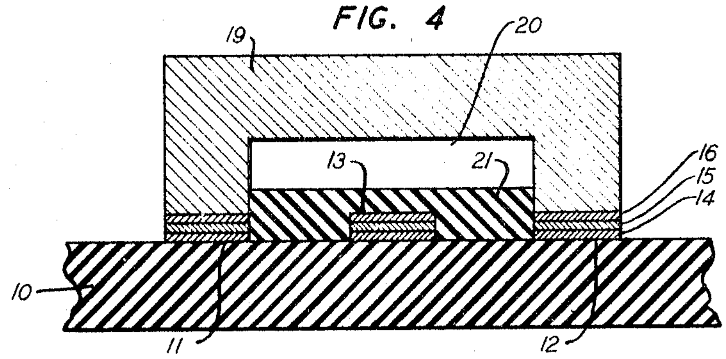
FIG. 4 is a cross section of the complete crossover.

FIG. 4 shows the completed crossover made in accordance with the invention. The spacing layer 18 of FIG. 3 has been removed leaving an air gap 20, and the layer of oxidizable metal 17 has been oxidized to form a layer of dielectric oxide 21.

It is understood that the above-described processes are simply illustrative of the many possible specific applications of the invention. For example, while the invention is referred to in the specific context of spacing apart an upper and lower conducting layer it may equally well be used to space apart adjacent conductors on the same plane. Numerous and varied modifications may be made by one skilled in the art without departing from the spirit and scope of the invention.

I claim:

1. A method for forming two closely spaced conductive layers comprising the steps of:

depositing a first conductive layer on a substrate, depositing a spacing layer of a thin film of filler material on top of said first conductive layer, depositing a second conductive layer on the filler which includes a crossover region with respect to said first layer, and etching away selectively the filler material, leaving the two conductive layers separated by a space and insulated electrically from one another in the crossover region, and eliminating any exposed pinhole shorts.

2. The method in accordance with claim 1 including the additional step of partially oxidizing at least one of said conductive layers to form a solid dielectric layer between them.

3. The method in accordance with claim 1 including the additional step of filling the space between the two conductive layers with a solid dielectric material after etching away the filler material.

4. The method in accordance with claim 1 including the additional step of filling the space between the two conductive layers with material by either plasma or thermal "cracking," anodization, or chemical reaction with the conductive layers after etching away the filler material.

5. The method in accordance with claim 1 including the additional step of eliminating exposed pinhole shorts by ultrasonic cleaning, etching, centrifuging, or exposure to a reactive gas.

6. The method according to claim 1 wherein:

said first conductive layer is a composite layer including films of titanium and gold;

said filler material is copper;

and said second conductive layer is gold.

7. A method for forming two closely spaced conductive layers comprising the steps of:

depositing a first conductive layer on a substrate;

depositing a layer of an oxidizable metal on said first conducting layer;

depositing a spacing layer of a thin film of filler material on said oxidizable layer;

depositing on the spacing layer a second conductive layer which includes a crossover region with respect to said first layer;

etching away selectively the filler material, leaving the two conductive layers insulated electrically from one another in the crossover region;

eliminating any pinhole shorts; and oxidizing said oxidizable metal to produce a dielectric layer.

8. The method according to claim 7 wherein:

said first conductive layer is a composite layer including films of titanium and gold;

said oxidizable metal is zirconium;

said filler material is copper;

and said second conductive layer is gold.

References Cited

UNITED STATES PATENTS

| | | | |
|---|---|---|---|
| 1,595,810 | 8/1926 | Allcut | 29—25.41 |
| 2,607,825 | 8/1952 | Eisler | 29—25.42 XR |
| 3,044,160 | 7/1962 | Jaffee | 29—423 |
| 3,234,442 | 2/1966 | Maissel et al. | 29—25.42 XR |
| 3,325,882 | 6/1967 | Chiou et al. | 29—423 XR |

FOREIGN PATENTS

| | | | |
|---|---|---|---|
| 836,812 | 6/1960 | Great Britain. | |

JOHN F. CAMPBELL, Primary Examiner

R. B. LAZARUS, Assistant Examiner

U.S. Cl. X.R.

29—423, 424